United States Patent
Cellier et al.

(10) Patent No.: US 9,458,720 B2
(45) Date of Patent: Oct. 4, 2016

(54) AIRFOIL AND PLATFORM ASSEMBLY FOR SUPERSONIC FLOW

(75) Inventors: Damien Cellier, Paris (FR); Vincent Paul Gabriel Perrot, Maisons Alfort (FR); Jean-Francois Rios, Nandy (FR)

(73) Assignee: SNECMA, Paris (FR)

( * ) Notice: Subject to any disclaimer, the term of this patent is extended or adjusted under 35 U.S.C. 154(b) by 501 days.

(21) Appl. No.: 13/984,722

(22) PCT Filed: Feb. 6, 2012

(86) PCT No.: PCT/FR2012/050254
§ 371 (c)(1),
(2), (4) Date: Aug. 9, 2013

(87) PCT Pub. No.: WO2012/107677
PCT Pub. Date: Aug. 16, 2012

(65) Prior Publication Data
US 2013/0315738 A1 Nov. 28, 2013

(30) Foreign Application Priority Data

Feb. 10, 2011 (FR) ..................... 11 51070

(51) Int. Cl.
*F01D 5/14* (2006.01)
*F01D 5/02* (2006.01)
*G06F 17/50* (2006.01)

(52) U.S. Cl.
CPC ............... *F01D 5/02* (2013.01); *F01D 5/143* (2013.01); *F01D 5/145* (2013.01);
(Continued)

(58) Field of Classification Search
CPC ........ F01D 5/02; F01D 5/143; F04D 29/329; F04D 29/522; F05D 2240/80; F05D 2250/711; F05D 2250/713; F05D 2240/301; Y02T 50/673

USPC ............................................ 416/193 A
See application file for complete search history.

(56) References Cited

U.S. PATENT DOCUMENTS

2003/0143079 A1    7/2003   Kawarada et al.
2003/0170124 A1    9/2003   Staubach et al.
(Continued)

FOREIGN PATENT DOCUMENTS

CN    101960095 A    1/2011
DE    10 2008 021 053    10/2009
(Continued)

OTHER PUBLICATIONS

U.S. Appl. No. 13/984,769, filed Aug. 9, 2013, Cellier, et al.
(Continued)

*Primary Examiner* — Zelalem Eshete
(74) *Attorney, Agent, or Firm* — Oblon, McClelland, Maier & Neustadt, L.L.P

(57) ABSTRACT

An assembly including an airfoil and a platform on which the airfoil may be mounted, the surface of the platform presenting a circumferential depression between a leading edge and trailing edge of the airfoil, a deepest section of the depression being situated in an upstream half of the airfoil. A skeleton curve designates a curve of variations of a skeleton angle of the airfoil as a function of position along the axis of the wheel, and a linearized skeleton curve designates a curve of variations of an angle as a function of position along the axis of the wheel, the curve being a straight line connecting together points representing the skeleton angle respectively at 10% and at 90% of the axial extent of the airfoil from the leading edge. In a vicinity of the platform, the skeleton curve presents a raised portion that lies above the linearized skeleton curve.

10 Claims, 4 Drawing Sheets

(52) U.S. Cl.
CPC .... *G06F 17/5009* (2013.01); *F05D 2240/301* (2013.01); *F05D 2240/80* (2013.01); *F05D 2250/713* (2013.01); *Y02T 50/673* (2013.01)

(56) References Cited

U.S. PATENT DOCUMENTS

| | | | |
|---|---|---|---|
| 2008/0118362 A1* | 5/2008 | Hu et al. ................. | 416/223 |
| 2011/0189023 A1 | 8/2011 | Guimbard et al. | |

FOREIGN PATENT DOCUMENTS

| | | | |
|---|---|---|---|
| EP | 1 270 872 | | 1/2003 |
| EP | 1 270 872 A4 | | 8/2003 |
| FR | 2 928 174 | | 9/2009 |
| JP | 06257597 | * | 9/1994 |
| WO | WO 96/00841 A1 | | 1/1996 |

OTHER PUBLICATIONS

International Search Report issued Apr. 11, 2012 in PCT/FR12/050254 Filed Feb. 6, 2012.

Combined Chinese Office Action and Search Report issued Sep. 28, 2014 in Patent Application No. 2012800085422 with English language translation and English Translation of Category of Cited Documents.

* cited by examiner

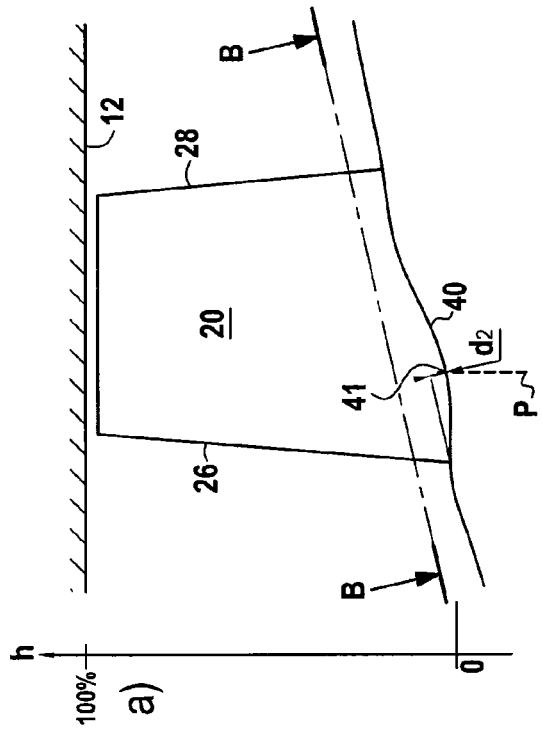
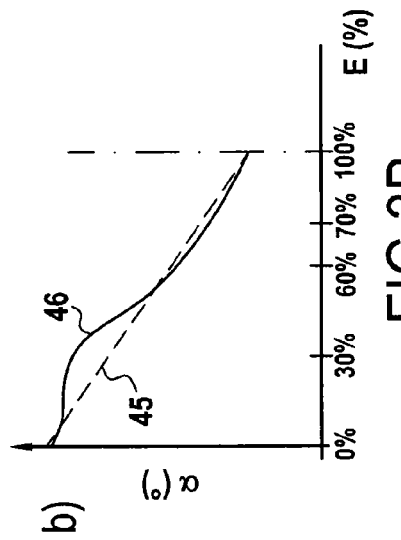
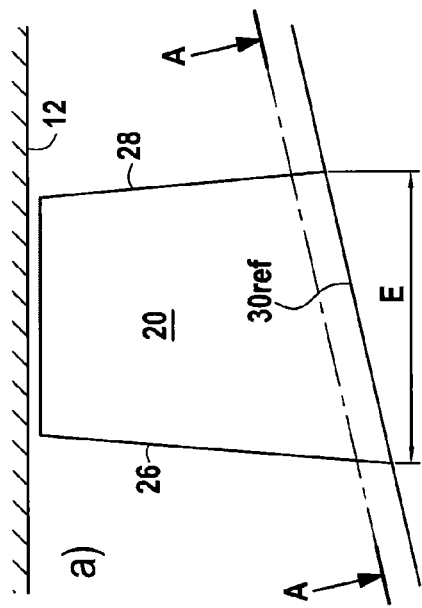
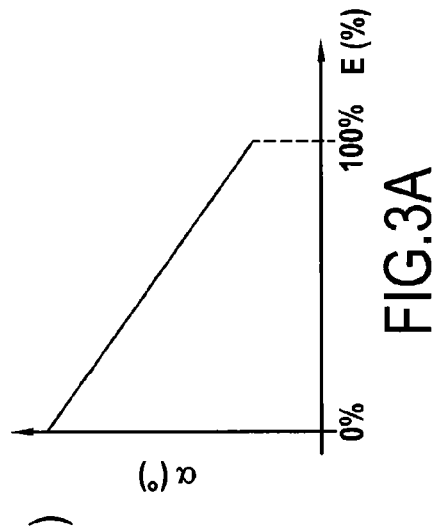
FIG.3A
FIG.3B

AIRFOIL AND PLATFORM ASSEMBLY FOR SUPERSONIC FLOW

BACKGROUND OF THE INVENTION

1. Field of the Invention

The invention relates to an assembly comprising an airfoil for a turbine engine bladed wheel together with a platform on which the airfoil is to be mounted, the assembly as formed in this way being arranged in such a manner that a plurality of airfoils fastened on the platform or on a plurality of assembled-together platforms can form a bladed wheel. The term "platform" is used herein to designate a part that defines the radially inner side of an interblade passage formed between two adjacent airfoils of a bladed wheel. The term "platform surface" is used to designate the platform surface that faces the interblade passage. The platform surface may also designate the assembly of the platform surfaces of a bladed wheel considered collectively.

2. Description of the Related Art

In known manner, the airfoils of a bladed wheel may be made integrally with the rotor disk in order to constitute a bladed wheel. The part made in this way that combines both airfoils and their platforms is referred to as a one-piece bladed wheel. In another embodiment, the airfoils are made independently from the rotor disk (i.e. they constitute distinct parts). Under such circumstances, the airfoils are formed with respective roots enabling them to be fastened to the rotor disk, thereby constituting blades. The assembly comprising blades on the rotor disk thus constitutes a bladed wheel.

The invention seeks an advantageous arrangement of an airfoil relative to the platform surface; such an arrangement may be provided in the various constructions described above, independently of whether the platform and the airfoil do or do not constitute distinct parts.

The invention seeks more particularly to make assemblies as described above for making bladed wheels of (high pressure or low pressure) compressors, and in particular of multistage compressors that are to be found in turbine engines or in helicopter turboshaft engines. The invention may also be used for making blades or bladed wheels for the turbines of turbine engines (which turbines may be high pressure or low pressure turbines).

The aerodynamic efficiency of a compressor stage (equal to the ratio of the ideal work (the ideal work being the work associated with an isentropic transformation) and the work generally delivered to the fluid in order to obtain a given pressure increase between the upstream and downstream ends of the compressor stage) in a turbine engine depends not only on the shape of the airfoils, but also on the shape of the platforms. In order to improve this efficiency, it is known to modify the platform surface in one or more bladed wheels so as to locally increase or decrease the flow section for the fluid stream through the bladed wheel(s). For this purpose, and in known manner, the platform is modified by arranging a circumferential depression and/or a circumferential bulging area in its surface level with the airfoils. (The term "circumferential" is used herein with respect to a depression or a bulging area to designate a depression or a bulging area that is substantially a surface of revolution, naturally with the exception of the immediate vicinity of the airfoils.) Such a modification, known as "contouring" serves to improve the aerodynamic efficiency of the bladed wheel and more generally of the compressor stage. The terms "depression" and "bulging area" should be understood with reference to a theoretical surface radially defining the inside of the passage and varying linearly from upstream to downstream of the bladed wheel.

Nevertheless, in spite of the increase in efficiency as obtained in this way for the bladed wheel, such a modification generally also gives rise to certain undesirable effects on the fluid stream. Specifically:

it may give rise to high pressure gradients at the outlet from the bladed wheel; such gradients are harmful to the operation of the bladed wheel, and in particular to the overall efficiency of the turbine engine, in particular in multistage compressors;

it may give rise to non-uniformities in speed distributions around the airfoils, in particular in the vicinity of their roots; and finally, it may lead to a modification in the compression ratio of the wheel (where the compression ratio is equal to the ratio of the pressures upstream and downstream of the bladed wheel).

When such undesirable side effects are observed, they are generally remedied by modifying the shape of the bladed wheels situated in the fluid passage downstream from the bladed wheel under consideration. Nevertheless, such modifications cannot conserve the improvement in efficiency made possible by modifying the platform surface of the bladed wheel under consideration; in addition, it is not always possible to make such modifications.

BRIEF SUMMARY OF THE INVENTION

The object of the invention is to remedy such drawbacks by proposing an assembly comprising an airfoil for a turbine engine bladed wheel and a platform on which the airfoil is suitable for being mounted:

a plurality of said airfoils being suitable for being fastened to said platform or to a plurality of said platforms assembled together so as to form a bladed wheel having a wheel axis and defining upstream and downstream directions along that axis, the airfoils being arranged radially in the wheel;

in said wheel, the platform or the assembled-together platforms presenting a surface between the airfoils that is referred to as a platform surface and that radially defines the inside of gas-passing passages formed between the airfoils; and said platform surface presenting a circumferential depression extending axially substantially between a leading edge and a trailing edge of an airfoil, a deepest section of said depression being situated axially in the upstream half of the airfoil;

which assembly provides the bladed wheel with good aerodynamic efficiency, ensures pressure gradients downstream from the bladed wheel that are similar to those which would be observed in the absence of the circumferential depression in the surface of the platform, and enables relatively uniform distributions of fluid speed to be obtained, in particular in the vicinity of the blade roots, and makes this possible for blades that are to operate in a flow that is supersonic.

In order to present the solution provided by the invention, the following elements are defined:

The "vicinity" of the platform relates to the portion of the airfoil situated at a short distance (e.g. less than 40% of the height of the airfoil) above the fillets connecting the airfoil to the platform. The skeleton angle is the angle formed by the neutral fiber of the airfoil relative to the axis of the bladed wheel in a plane perpendicular to the longitudinal direction of the airfoil, the sign of the skeleton angle being selected in such a manner that the upstream skeleton angle (the skeleton angle at the leading edge of the airfoil) is positive.

The skeleton curve is the curve plotting variations in a skeleton angle of an airfoil in a section plane that is parallel to the platform surface, as a function of position along the axis of the wheel.

The linearized skeleton curve is the curve representing variations of an angle as a function of position along the axis of the wheel, which angle makes a straight line connection between the points representing the skeleton angle respectively at 10% and at 90% of the axial extent of the airfoil from its leading edge. The linearized skeleton angle, represented by the linearized skeleton curve, is thus equal to the skeleton angle at 10% and at 90% of the axial extent of the airfoil from the leading edge (the upstream and downstream ends of the airfoil, which may be subjected to specific arrangements, are not taken into account).

The invention achieves the above-specified objects by the fact that in an assembly as specified above, in the vicinity of the platform, the skeleton curve presents a raised portion that lies above the linearized skeleton curve.

Thus, the invention consists in locally modifying the shape of the airfoil so as to enable the skeleton curve to be raised (which amounts to "closing" the skeleton angle, in the sense that the skeleton angle in the section under consideration increases in absolute value relative to the linearized skeleton curve), so as to match the airfoil to the modification in the stream induced by the circumferential depression arranged in the platform. It may be considered that the skeleton curve is raised in this way when at least one point of the curve lies at more than 3° above the linearized skeleton curve. Altering the airfoil in the vicinity of the platform serves to optimize the operation of the bladed wheel, given the modification to the platform surface that is constituted by the circumferential depression.

The axial extent of the airfoil (written E below) designates the distance measured from the airfoil root along the axis of the bladed wheel between the leading edge and the trailing edge of the airfoil.

In an assembly of the invention, because of the raised portion presented by the curve plotting variation in the skeleton angle over a radially lower portion of the airfoil and known as the "skeleton" curve, the stream of gas or air is deflected in such a manner as to:

limit the acceleration induced by the application of "contouring" in the frame of reference relative to the blade in the vicinity of the circumferential depression. Limiting the increase in the speed of the fluid stream thus makes it possible to reduce shockwave losses (by closing the skeleton angle, in particular in the range 0° to 40% of the axial extent of the airfoil); and limit the increase in the flow rate in the vicinity of the platform as induced by the circumferential depression, so as to restore the flow rate gradient to its initial value, i.e. the value it would have had if there were no circumferential depression, or more generally if there were no contouring.

Furthermore, in supersonic flow, a bladed wheel incorporating assemblies of the invention presents good aerodynamic efficiency, with pressure gradients downstream from the bladed wheel that are similar to those that would be observed in the absence of the circumferential depression, and with fluid speed distributions in the vicinity of the blade root that are relatively uniform.

The assembly of the invention may be the subject of the following improvements:

A plane in which an offset between the skeleton curve and the linearized skeleton curve is at a maximum may substantially coincide with the plane of said deepest section.

A plane in which an offset between the skeleton curve and the linearized skeleton curve is at a maximum may be situated axially between the position at 0.5×N % of the deepest section and 1.5×N %, the value N being a percentage expressed relative to the axial extent of the airfoil from its leading edge.

The deepest section may be situated axially in the range 15% to 40% of the axial extent of the airfoil from its leading edge.

The skeleton curve and the linearized skeleton curve may intersect at a point situated in the range 50% to 75% of the axial extent of the airfoil from its leading edge.

The skeleton curve may present a lowered portion lying under the linearized skeleton curve and situated axially downstream from said raised portion. Because of the lowered portion over a radially inner portion of the airfoil, the deflection imposed on the fluid is limited, thereby making it possible to cancel the increase in the stream-profile offset at the trailing edge of the airfoil as induced by altering the circumferential depression (the stream-profile offset being the offset between the direction of the stream in the vicinity of the trailing edge and the downstream skeleton angle). The opening of the flow passage induced by the circumferential depression leads to the airfoil being unprimed, thus enabling this alteration to be applied. Returning the stream-profile offset to its original value makes it possible to conserve the outlet angle of the fluid and thus to conserve the compression ratio gradient while improving the aerodynamic performance of the airfoil.

A second object of the invention is to provide a turbine engine blade comprising a platform formed integrally with at least one airfoil, that imparts good aerodynamic efficiency to a bladed wheel made up with the help of such blades, that provides pressure gradients downstream from the bladed wheel similar to those that would be observed in the absence of the circumferential depression in the platform surface, and that makes it possible to obtain relatively uniform speed distributions, in particular in the vicinity of the blade root.

This object is achieved by the fact that the turbine engine blade comprises an assembly as defined above. The platforms of such blades are generally arranged in such a manner that they define the entire interblade surface radially defining the inside of the gas flow passages that exist between the airfoils.

A third object of the invention is to provide a turbine engine bladed wheel that presents good aerodynamic efficiency, pressure gradients downstream from the bladed wheel similar to those that would be observed in the absence of a circumferential depression in the platform surface, and speed distributions that are relatively uniform, in particular in the vicinity of the blade root.

This object is achieved by the fact that the bladed wheel is formed with blades as defined above, or else is formed with at least one assembly as defined above. A one-piece bladed wheel constitutes an example of such a bladed wheel.

Finally, the invention may advantageously be incorporated in a turbine engine including at least one bladed wheel as defined above.

BRIEF DESCRIPTION OF THE SEVERAL VIEWS OF THE DRAWINGS

The invention can be well understood and its advantages appear better on reading the following detailed description of embodiments given as non-limiting examples. The description refers to the accompanying drawings, in which:

FIGS. 3A and 3B are figures showing an assembly comprising a platform associated with an airfoil and comprising:
a) a diagrammatic view of the assembly as seen in the circumferential direction; and
b) a graph showing the skeleton curve of the airfoil of said assembly;
where FIG. 3A shows a prior art assembly and FIG. 3B shows an assembly constituting a first embodiment of the invention;

In the various figures, elements that are identical or similar are given the same references.

DETAILED DESCRIPTION OF THE INVENTION

Figure 1:
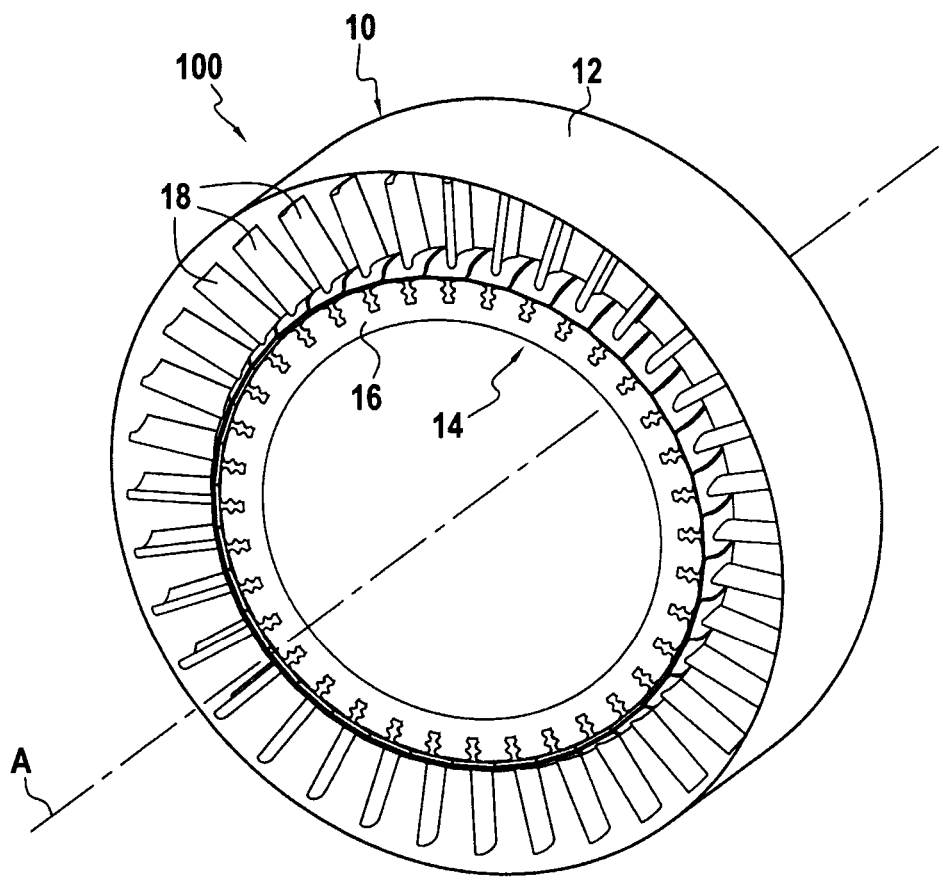
FIG. 1 is a diagrammatic perspective view of a compressor stage of a turbine engine of the invention.

FIG. 1 shows a portion of an axial-flow compressor 10 in a turbine engine 100. The compressor 10 comprises a casing 12 having a bladed wheel 14 mounted therein. The bladed wheel 14 itself comprises a rotor disk 16 having radial blades 18 fastened thereon in conventional manner in an axisymmetric configuration. The bladed wheel is arranged to be capable of turning about an axis of rotation A inside the casing 12.

Figure 2:
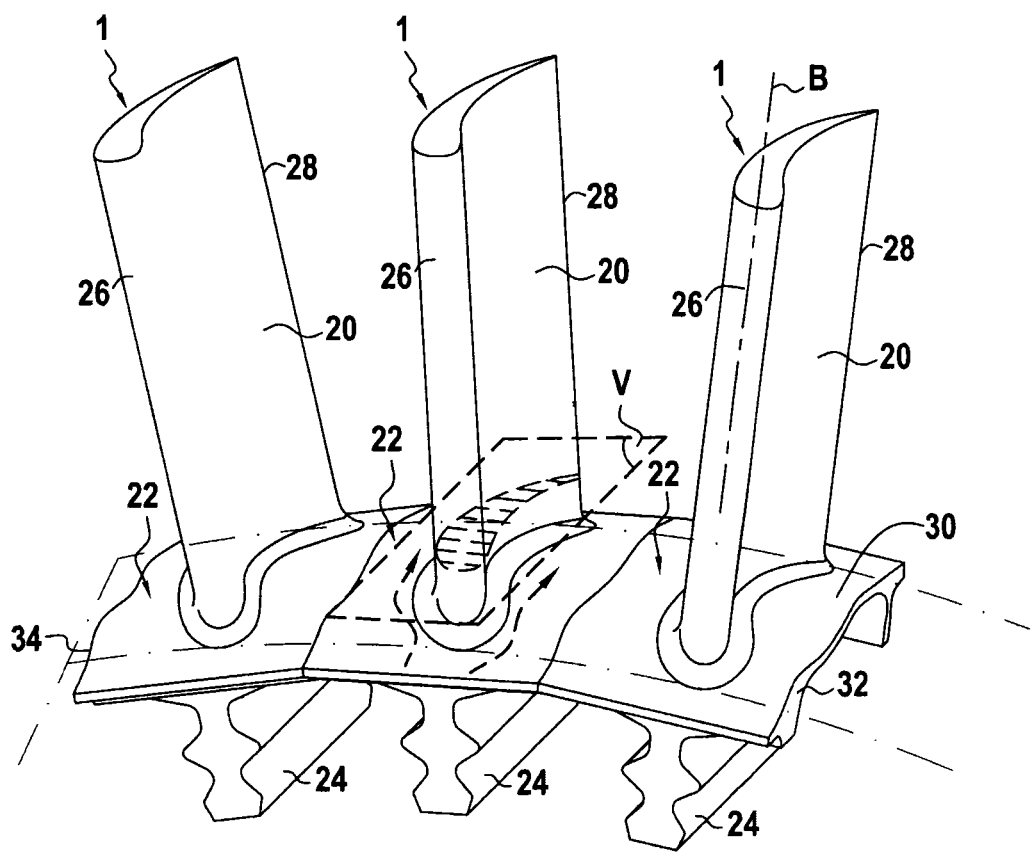
FIG. 2 is a diagrammatic perspective view of three assemblies of the invention, forming a part of the wheel shown in FIG. 1.

The arrangement of the blades 18 on the bladed wheels 14 is shown in greater detail by FIG. 2, which shows a fragment of the wheel 14.

In the wheel 14, each blade 18 forms an assembly 1 associating an airfoil 20, a platform 22, and a blade root 24. The blade platforms 22 are thus made integrally with the airfoils 20. Naturally, the invention may be implemented in other types of bladed wheel, in which the airfoils and the platform(s) constitute distinct parts.

The roots 24 serve to fasten the blades 18 to the rotor disk 16.

The platforms 22 associated within the bladed wheel 14 make up a platform surface 30 that defines the radially inner side of the inter-blade passages that allow gas to pass between the blades. This platform surface is approximately a surface of revolution—or at least it may be approximated by a surface of revolution.

The blades 18 are arranged in such a manner that when they are assembled together so as to make up the wheel 14, the platforms of the blades define the entire platform surface 30 formed between the airfoils 20. Thus, no additional portion forms a portion of or shapes the platform surface 30. In order to enable the blades 18 to be assembled together, the edges 32 on one of the sides in the circumferential direction of the bladed wheel of a platform are complementary in shape to the edges 34 of the platforms situated on the opposite sides relative to the circumferential direction C.

Each airfoil 20 has a leading edge 26 and a trailing edge 28, and it extends radially in a radial direction B that is specific to each airfoil.

In FIG. 2, there can be seen a section plane V that constitutes a section plane substantially parallel to the platform surface 30, and it is situated in the vicinity of the root of the airfoil 20.

Figure 5:
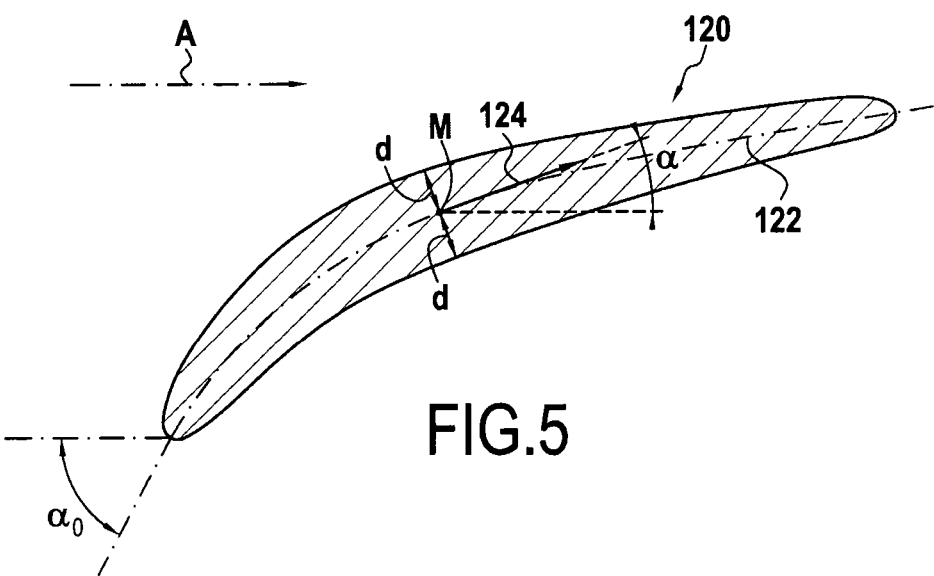
FIG. 5 is a section of an airfoil of an assembly of the invention.

FIG. 5 is a section of an airfoil 120 of a turbine engine blade in a plane perpendicular to the longitudinal axis of the airfoil.

This section shows the neutral fiber 122 of the airfoil for the plane in question. The neutral fiber is the set of points of the airfoil that are equidistant from the two side faces of the airfoil (its pressure side and its suction side). For example, the point M shown is at the same distance d from the pressure side and from the suction side. The skeleton angle $\alpha$ at the point M is the angle between the tangent 124 to the neutral fiber at the point M and the axis A of the wheel. The skeleton angle $\alpha_0$ or upstream skeleton angle is the skeleton angle at the leading of the airfoil 120.

FIGS. 3A and 3B show respectively an assembly 1 (combining a platform 22 and an airfoil 20) in a prior art embodiment and in an embodiment of the invention.

FIG. 3A:

The platform surface 30 shown in FIG. 3Aa) has not been subjected to any specific alteration along the axis of the airfoil 20 (i.e. along the axis A). This platform surface is thus a reference platform surface $30_{ref}$ that is substantially conical.

In FIG. 3Ab), there is plotted the curve showing the variations in the skeleton angle of the FIG. 3Aa) airfoil in the plane A-A (the plane marked in chain-dotted lines in FIG. 3Aa)), as a function of axial position along the axis of the wheel 14. Axial position is marked in percentage as a function of position relative to the axial extent E of the airfoil 20. The axial extent E is the distance along the axis A between the leading edge 26 and the trailing edge 28 at the root of the airfoils 20 (FIG. 3Aa)). The airfoil 20 of the assembly shown in FIG. 3A is an airfoil of the type in which the skeleton curves and the linearized skeleton coincide, as shown in FIG. 3Ab).

FIG. 3B:

FIG. 3B shows an embodiment of the invention. In this embodiment, the platform surface 30 has been altered along the airfoil 20.

The alterations made are defined radially in relative manner relative to the reference platform surface $30_{ref}$. This surface $30_{ref}$ is defined as the substantially conical surface approximating the platform surface 30, this reference surface $30_{ref}$ being determined while ignoring both the circumferential depression and also any other localized alterations (if any and whether circumferential or otherwise) that might project from or be set back in the platform surface at various axial locations along the airfoils 20.

The surface alterations of the platform 30 and of the airfoils 20 are also defined axially relative to the axial extent E of the airfoils 20.

The platform surface 30 is altered to have a circumferential depression 40 (FIG. 3Ba)). The term "depression" is used to mean a portion of the platform surface that lies radially inside the reference platform surface $30_{ref}$ and corresponds to the airflow passage locally being enlarged.

The circumferential depression 40 extends axially between the leading edges 26 and the trailing edges 28 of the airfoils 20. The deepest axial section 41 (lying in a plane P perpendicular to the axis A of the wheel 14) of this depression 40 is situated axially in the upstream half of the airfoil 20. In the above sentence, the "deepest" section designates the section of the depression 40 for which the distance $d_2$ relative to the reference platform surface $30_{ref}$ is the greatest (see FIG. 3Ba)). In the embodiment shown (FIG. 3Bb)), the deepest section 41 is situated axially in the range 15% to 40% of the axial extent E of the airfoil from its leading edge, and more precisely at about 30% of this extent E.

The above-mentioned circumferential depression 40 improves the efficiency of the bladed wheel 14. Conversely, it disturbs the flow of the fluid in the vicinity of the platform surface compared with the flow made possible by the theoretical platform surface $30_{ref}$.

In the invention, in order to compensate for these disturbances, the shape of the airfoils 20 is modified in the manner shown in FIGS. 3Bb) and 4. This modification applies (in general manner) mainly to 40% of the height of the airfoils 20 at their radially inner ends. This modification appears in particular in a section plane of the airfoil (plane V, FIG. 2) that is substantially parallel to the surface of the platform, and that is situated in the vicinity of the platform.

Figure 4:
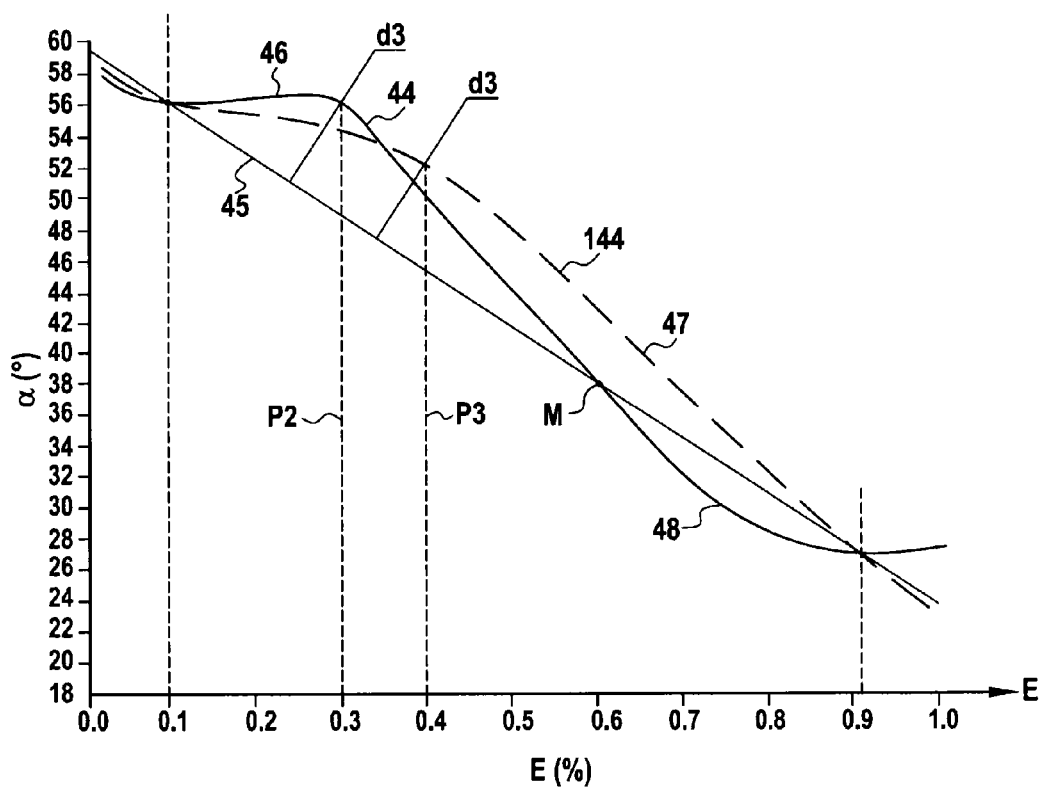
FIG. 4 is a graph showing two variants for the skeleton curve of an airfoil of an assembly of the invention, corresponding respectively to the first embodiment and to a second embodiment.

This modification is shown in FIG. 4 in which there can be seen:
- as a bold line, the skeleton curve 46 representing variations in the skeleton angle α of the airfoil 20 for the first embodiment of the invention (FIG. 3B);
- as a dashed line, the skeleton curve 47 representing the variations in the skeleton angle α of an airfoil in a second embodiment of the invention; and
- as a fine line, the linearized skeleton curve 45 of the airfoil 20, representing the variations in the linearized skeleton angle, which is the same for both embodiments.

In these various curves, the variations in the skeleton angle α are plotted as a function of axial position along the airfoil, this axial position being given as a percentage relative to the axial extent E of the airfoil 20.

In both embodiments, the shape of the platform surface is the same and is as shown in FIG. 3B.

The modification applied in the invention to the airfoil 20 consists in the fact that the skeleton angle curve presents a raised portion lying about the linearized skeleton curve 45. (The term "raised" is used to mean that the portion of the curve lies above the linearized skeleton angle curve: in other words, in the raised portion, the skeleton angle is greater in absolute value and is more closed than the linearized skeleton angle.) This raised portion is written 44 and 144 respectively for the first and second embodiments.

A notable characteristic of the raised portion is the position of the section $d_3$, which is the section for which the offset between the skeleton curve (46 or 47) and the linearized skeleton curve 45 is at a maximum, and more particularly the position of this section $d_3$ relative to the deepest section 41 of the circumferential depression 40. In the first embodiment (skeleton curve 46), the plane of the section $d_3$ (the plane perpendicular to the axis of the bladed wheel) coincides with the plane P (FIG. 3Bb)) of the deepest section 41 of the circumferential depression.

In general, the plane of the section $d_3$ is preferably situated axially on either side of the deepest section 41, i.e. between the position 0.5×N % of the deepest section 41 and 1.5×N %, where the value N is a percentage expressed relative to the axial extent E of the airfoil 20. In the embodiments described, and as mentioned above, the plane P (of the deepest section 41 of the circumferential depression 40) lies at about 30% of E. In application of the above criterion, the deepest section must therefore lie in the range 0.5×30% and 1.5%×30%, i.e. in the range 15% to 45% of E. This does indeed apply for the first embodiment since the section $d_3$ lies at 30% of E for the curve 46, and also for the second embodiment since the section $d_3$ of the curve 47 lies at 40% of E.

Furthermore, the skeleton curve may optionally have a lowered portion downstream from the raised portion. In the first embodiment, the raised portion 44 extends over a range going up to about 60% of the axial extent E. Downstream from the raised portion 44, the curve 46 presents a lowered portion 48. This portion extends axially from about 60% to about 90% of the axial extent E. Consequently, the skeleton curve 46 and the linearized skeleton curve 45 intersect at a point referenced M that lies in the range 50% to 75% of the axial extent E of the airfoil. In FIG. 4, it can be seen that the point M is situated at 60% of E.

In the second embodiment, and contrary to the first embodiment, the skeleton curve 47 does not have a lowered portion downstream from the raised portion. On the contrary, the skeleton curve 47 remains above the linearized skeleton curve 45, with a raised portion 144 extending over nearly all of the axial extent of the airfoil (in the range 10% to 90%).

The invention claimed is:

1. An assembly comprising:
   an airfoil for a turbine engine bladed wheel and a platform on which the airfoil is configured to be mounted:
   a plurality of the airfoils configured to be fastened to the platform or to a plurality of the platforms assembled together so as to form a bladed wheel including a wheel axis and defining upstream and downstream directions along the wheel axis, the airfoils being arranged radially in the wheel;
   in the wheel, the platform or the assembled-together platforms present a platform surface between the airfoils and that radially defines an inside of gas-passing passages formed between the airfoils; and
   the platform surface presenting a circumferential depression extending axially substantially between a leading edge and a trailing edge of an airfoil, a deepest section of the depression being situated axially in an upstream half of the airfoil;
   wherein:
   a skeleton curve is a curve representing variations of a skeleton angle of the airfoil in a section plane substantially parallel to the platform surface, as a function of position along the wheel axis;
   a linearized skeleton curve is a curve representing variations of an angle as a function of position along the wheel axis, which linearized skeleton curve is a straight line connecting together points representing the skeleton angle respectively at 10% and at 90% of the axial extent of the airfoil from the leading edge,
   in a vicinity of the platform, the skeleton curve presents a raised portion lying above the linearized skeleton curve, and
   a plane in which an offset between the skeleton curve and the linearized skeleton curve is at a maximum is situated axially between a position at 0.5×N % of the deepest section and 1.5×N %, the value N being a percentage expressed relative to axial extent of the airfoil from the leading edge.

2. An assembly according to claim 1, wherein a plane in which an offset between the skeleton curve and the linearized skeleton curve is at a maximum substantially coincides with the plane of the deepest section.

3. An assembly according to claim 1, wherein the deepest section is situated axially in a range of 15% to 40% of the axial extent of the airfoil from the leading edge.

4. A blade for a turbine engine, comprising:
an assembly according to claim 1, the blade comprising a platform formed integrally with at least one airfoil.

5. A turbine engine bladed wheel comprising blades according to claim 4.

6. A turbine engine bladed wheel comprising at least one assembly according to claim 1.

7. A turbine engine comprising at least one bladed wheel according to claim 5.

8. A turbine engine comprising at least one bladed wheel according to claim 6.

9. An assembly comprising:
an airfoil for a turbine engine bladed wheel and a platform on which the airfoil is configured to be mounted:
a plurality of the airfoils configured to be fastened to the platform or to a plurality of the platforms assembled together so as to form a bladed wheel including a wheel axis and defining upstream and downstream directions along the wheel axis, the airfoils being arranged radially in the wheel;
in the wheel, the platform or the assembled-together platforms present a platform surface between the airfoils and that radially defines an inside of gas-passing passages formed between the airfoils; and
the platform surface presenting a circumferential depression extending axially substantially between a leading edge and a trailing edge of an airfoil, a deepest section of the depression being situated axially in an upstream half of the airfoil;
wherein:
a skeleton curve is a curve representing variations of a skeleton angle of the airfoil in a section plane substantially parallel to the platform surface, as a function of position along the wheel axis;
a linearized skeleton curve is a curve representing variations of an angle as a function of position along the wheel axis, which linearized skeleton curve is a straight line connecting together points representing the skeleton angle respectively at 10% and at 90% of the axial extent of the airfoil from the leading edge,
in a vicinity of the platform, the skeleton curve presents a raised portion lying above the linearized skeleton curve, and a lowered portion lying under the linearized skeleton curve and situated axially downstream from the raised portion.

10. An assembly according to claim 9, wherein the skeleton curve and the linearized skeleton curve intersect at a point situated in a range of 50% to 75% of the axial extent of the airfoil from the leading edge.

* * * * *